United States Patent
Khan et al.

(10) Patent No.: US 7,495,465 B2
(45) Date of Patent: Feb. 24, 2009

(54) PVT VARIATION DETECTION AND COMPENSATION CIRCUIT

(75) Inventors: Qadeer A. Khan, New Delhi (IN);
Sanjay K Wadhwa, Saharanpur (IN);
Divya Tripathi, Bhopal (IN);
Siddhartha Gk, Puram (IN);
Kulbhushan Misri, Haryana (IN)

(73) Assignee: Freescale Semiconductor, Inc., Austin, TX (US)

( * ) Notice: Subject to any disclaimer, the term of this patent is extended or adjusted under 35 U.S.C. 154(b) by 263 days.

(21) Appl. No.: 11/490,441

(22) Filed: Jul. 20, 2006

(65) Prior Publication Data
US 2007/0018864 A1    Jan. 25, 2007

(30) Foreign Application Priority Data
Jul. 22, 2005    (IN)    .................................. 1925/2005

(51) Int. Cl.
| H03K 19/00 | (2006.01) |
| H03K 17/16 | (2006.01) |
| H03K 19/003 | (2006.01) |
| G06K 5/04 | (2006.01) |
| G11B 5/00 | (2006.01) |
| G11B 20/20 | (2006.01) |
| G06F 11/00 | (2006.01) |
| G06F 11/30 | (2006.01) |
| G01R 31/28 | (2006.01) |
| G08C 25/00 | (2006.01) |
| H03M 13/00 | (2006.01) |
| H04L 1/00 | (2006.01) |

(52) U.S. Cl. ................. 326/26; 326/8; 326/21; 714/699; 714/700; 714/701; 714/724; 714/746

(58) Field of Classification Search ........................ None
See application file for complete search history.

(56) References Cited

U.S. PATENT DOCUMENTS

| 5,498,977 | A | 3/1996 | Pickup | |
| 5,892,409 | A | 4/1999 | Boerstler | |
| 6,218,886 | B1 | 4/2001 | Balistreri et al. | |
| 6,417,727 | B1 | 7/2002 | Davis | |
| 6,486,699 | B1 | 11/2002 | Friebe et al. | |
| 6,504,420 | B1 | 1/2003 | Vorenkamp et al. | |
| 6,646,483 | B2 * | 11/2003 | Shin | ............................ 327/112 |
| 6,653,890 | B2 | 11/2003 | Ono et al. | |
| 6,822,504 | B2 | 11/2004 | Morikawa | |
| 6,844,755 | B2 | 1/2005 | Ajit | |
| 2004/0012449 | A1 * | 1/2004 | Illegems | ....................... 331/57 |
| 2005/0134364 | A1 | 6/2005 | Bhattacharya et al. | |

* cited by examiner

*Primary Examiner*—Rexford Barnie
*Assistant Examiner*—Matthew C Tabler
(74) *Attorney, Agent, or Firm*—Charles Bergere

(57) ABSTRACT

A compensation circuit and a method that compensates for process, voltage and temperature (PVT) variations in an integrated circuit that includes functional modules. The compensation circuit includes a signal generator, a first code generator, a second code generator, and a mapping module. The signal generator generates a first signal and a second signal depending on aligned process corner, voltage and temperature variations and skewed process corner variations respectively. The first code generator receives the first signal, and generates a first calibration code. The second code generator receives the second signal, and generates a second calibration code. The mapping module provides the first and second calibration codes for compensating for the aligned process corner, voltage and temperature variations and the skewed process corner variations associated with the functional modules respectively.

11 Claims, 5 Drawing Sheets

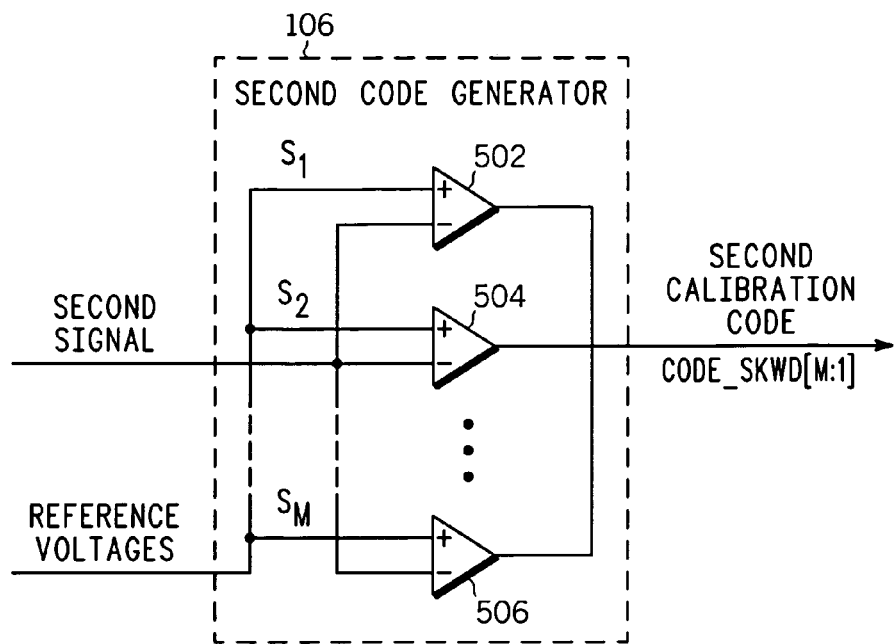
*FIG. 5*
*FIG. 6*
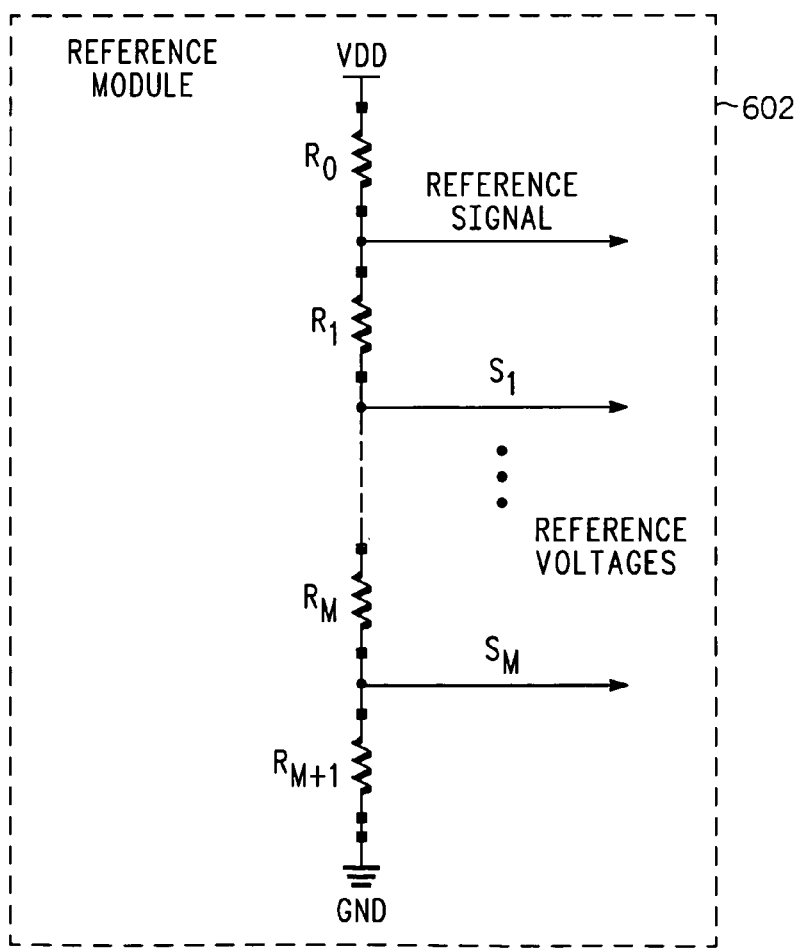

PVT VARIATION DETECTION AND COMPENSATION CIRCUIT

BACKGROUND OF THE INVENTION

The present invention relates generally to the field of integrated circuits (ICs) and in particular, to process, voltage, and temperature (PVT) variations in ICs.

PVT variations are one of the critical factors that hamper the performance of the ICs. For example, PVT variations can result in a change in setup and hold times of synchronous circuits. Different components of a synchronous circuit are driven by a common system clock. Therefore, a change in the setup or hold times corresponding to any one component can result in erroneous circuit output. PVT variations can also result in fast switching in signals, which can cause electromagnetic interference (EMI). Further, PVT variations may cause current leakage.

One technique for reducing PVT variations of a circuit is based on sensing variations in the operation of the circuit, and taking appropriate action to reduce these variations. For example, if a variation in the signal delay is identified in the circuit, then the input signal delay is changed to compensate for the variation.

Another technique to compensate for PVT variations uses a control value. The circuit output is compensated for by regulating the control value so that the output corresponds to typical input-output characteristics of the circuit. However, variations in the control value cannot be controlled. Yet another technique measures changes in RC time constants due to PVT variations and compensates for the PVT variations in the capacitors.

Some of the techniques mentioned above do not distinguish between different process corners at which the IC is fabricated. Therefore, the techniques do not provide sufficient compensation for the PVT variations. Further, memory space is required to compensate for the voltage variations in the IC.

BRIEF DESCRIPTION OF THE DRAWINGS

The following detailed description of preferred embodiments of the present invention will be better understood when read in conjunction with the appended drawings. The present invention is illustrated by way of example and not limited by the accompanying figures, in which like references indicate similar elements.

FIG. 5 is a schematic circuit diagram of a second code generator of the compensation circuit of FIG. 1 in accordance with an embodiment of the present invention;

FIG. 6 is a schematic circuit diagram of a reference module in accordance with an exemplary embodiment of the present invention;

DETAILED DESCRIPTION OF THE PRESENT INVENTION

Figure 1:
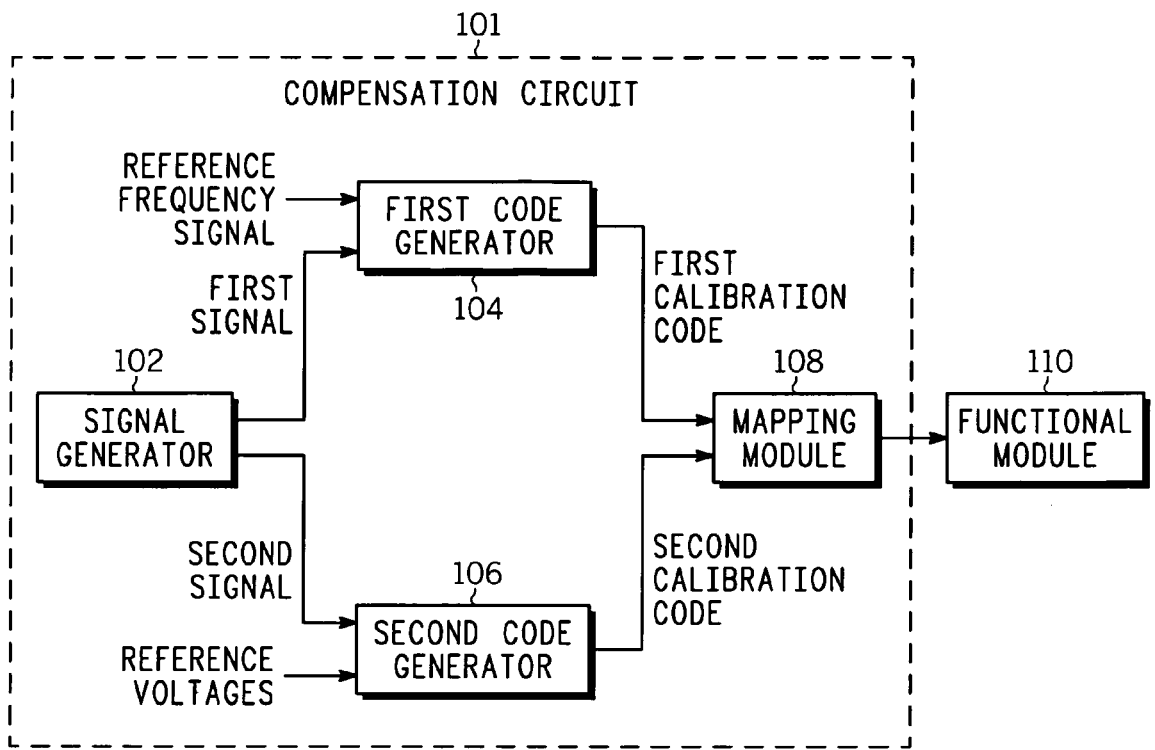
FIG. 1 is a schematic block diagram of a compensation circuit in accordance with an embodiment of the present invention.

The detailed description in connection with the appended drawings is intended as a description of the presently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

The compensation circuit of the present invention can be implemented in an integrated circuit (IC) and is suitable for detecting process corners at which the IC is fabricated. The process corners indicate the performance metrics of devices in the IC, in terms of their timing behavior. The devices include NMOS and corresponding PMOS transistors. The PVT variations associated with the PMOS and the NMOS transistors are different in case of aligned process corners and skewed process corners. For example, in case of the skewed process corners, the NMOS transistors correspond to a best case and the PMOS transistors correspond to a worst case, or vice versa. Whereas, in case of the aligned process corners, both the NMOS and the PMOS transistors correspond to either the best case or the worst case.

The present invention provides a compensation circuit that compensates for PVT variations in an integrated circuit. The integrated circuit includes a plurality of functional modules and the compensation circuit includes a signal generator, a first code generator, a second code generator, and a mapping module. The signal generator generates a first signal and a second signal. The first signal depends on aligned process corner, voltage and temperature variations associated with a plurality of transistors of the signal generator. The second signal depends on skewed process corners associated with the plurality of transistors of the signal generator. The signal generator is coupled to a first code generator and a second code generator. The first code generator receives the first signal and generates a first calibration code. The second code generator receives the second signal and generates a second calibration code. The mapping module is coupled to the first code generator and the second code generator. The mapping module receives the first and the second calibration codes. The mapping module provides the first and the second calibration codes to the plurality of functional modules. The first calibration code compensates for the aligned process corner, voltage and temperature variations associated with the plurality of functional modules. The second calibration code compensates for the variations associated with the skewed process corners in the plurality of functional modules.

In another embodiment of the present invention, the present invention provides a compensation circuit that compensates for PVT variations in an integrated circuit. The integrated circuit includes a plurality of functional modules and the compensation circuit includes a signal generator, a current controlled oscillator (CCO), a counter, at least one comparator, and a mapping module. The signal generator generates a first signal and a second signal. The first signal depends on aligned process, voltage and temperature variations associated with a plurality of transistors of the signal generator. The second signal depends on skewed process corners associated with the plurality of transistors of the signal generator. The CCO is coupled to the signal generator. The CCO generates a digital signal based on the first signal. The counter is coupled to the CCO. The counter generates a first calibration code based on the digital signal. The first calibration code is generated by counting a number of pulses of the digital signal in a clock cycle of a reference frequency signal. The at least one comparator is coupled to the signal generator, and compares the second signal with at least one reference voltage to generate a second calibration code. The mapping module is coupled to the counter and the at least one comparator. The mapping module provides the first and the second calibration codes to the plurality of functional modules. The first calibration code compensates for the aligned process corner, voltage and temperature variations associated with the plurality of functional modules. The second calibration code compensates for the variations associated with the skewed process corners in the plurality of functional modules.

In yet another embodiment of the present invention, a method for compensating for PVT variations in an integrated circuit is provided. The integrated circuit includes a plurality of functional modules. The method includes generating a first signal, generating a second signal, generating a first calibration code, generating a second calibration code, mapping the first calibration code onto the plurality of functional modules, and mapping the second calibration code onto the plurality of functional modules. The first signal depends on aligned process, voltage and temperature variations associated with a plurality of transistors. The second signal depends on skewed process corners associated with the plurality of transistors. The first calibration code is based on the first signal. The second calibration code is based on the second signal. The first calibration code is mapped onto the plurality of functional modules to compensate for the aligned PVT variations associated with the plurality of functional modules. The second calibration code is mapped onto the plurality of functional modules to compensate for the PVT variations associated with the skewed corners in the plurality of functional modules.

The compensation circuit detects and compensates for the aligned PVT variations and skewed process corners variations independently. Hence, the compensation circuit compensates for the PVT variations in a real-time environment. Further, the compensation circuit does not require memory or storage space.

Referring now to FIG. 1, a schematic block diagram of a compensation circuit 101 in accordance with an embodiment of the present invention is shown. The compensation circuit 101 includes a signal generator 102, a first code generator 104, a second code generator 106, and a mapping module 108. The compensation circuit 101 compensates for the PVT variations in a functional module 110. For the sake of simplicity, only one functional module is shown in FIG. 1. However, the number of the functional modules may be higher, depending on the performance requirements of the IC. The functional modules may be analog, combinational, or sequential logic circuits. In various embodiments of the present invention, the functional modules are devices such as I/O drivers, ring oscillators, operational amplifiers, delay lines, universal serial bus transmitters, serial advanced technology attachment transmitters, and low voltage differential signaling transmitters.

The signal generator 102 generates a first signal and a second signal. The first signal depends on the aligned process, voltage and temperature variations associated with transistors in the signal generator 102. The second signal depends on the skewed process corners associated with the transistors in the signal generator 102. In an embodiment of the present invention, the first signal is a current signal and the second signal is a voltage signal.

The signal generator 102 is connected to the first code generator 104 and the second code generator 106. The first code generator 104 receives the first signal and generates a first calibration code based on the first signal. The second code generator 106 receives the second signal and generates a second calibration code based on the second signal. The mapping module 108 maps the first and the second calibration codes onto the functional module 110. The first calibration code compensates for the aligned process corner, voltage and temperature variations associated with the functional module 110. The second calibration code compensates for the variations associated with the skewed process corners in the functional module 110.

Figure 2:
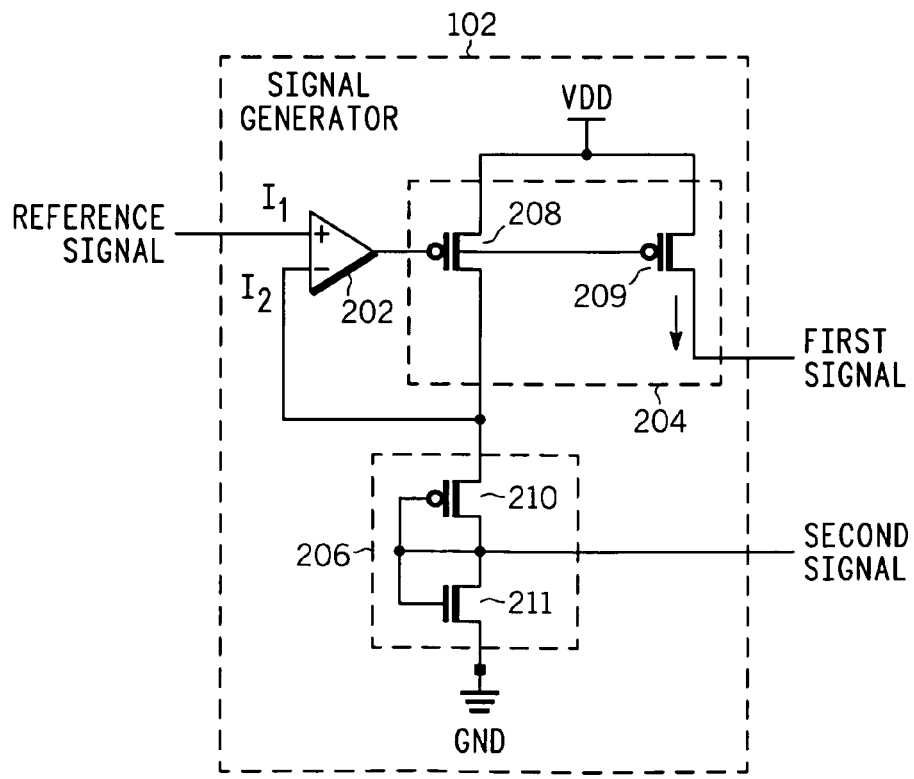
FIG. 2 is a schematic circuit diagram of a signal generator of the compensation circuit of FIG. 1 in accordance with an exemplary embodiment of the present invention.

FIG. 2 is a schematic circuit diagram of the signal generator 102 in accordance with an exemplary embodiment of the present invention. The signal generator 102 includes a comparator 202, an aligned process module 204, and a skewed process module 206. The comparator 202 receives a reference signal at a first input ($I_1$). In one embodiment, the reference signal is about 2.2v. The reference signal is generated by a reference module 602, which is explained later in conjunction with FIG. 6. A reference current is generated at the output of the comparator 202. The reference current is generated by dividing the voltage corresponding to the reference signal by a load resistance. The load resistance is implemented by a PMOS transistor 210 and an NMOS transistor 211, which are connected to each other. The aligned process module 204 includes first and second PMOS transistors 208 and 209 that are connected to each other. The reference current is received by the aligned process module 204. For this purpose, the gates of the first and second PMOS transistors 208 and 209 are connected to the output of the comparator 202. The sources of the first and second PMOS transistors 208 and 209 are connected to a voltage VDD. The first signal is generated at the drain of the second PMOS transistor 209, while the drain of the first PMOS transistor 208 is input to the comparator 202 at a second input ($I_2$). The skewed process module 206 includes the PMOS transistor 210 and the NMOS transistor 211. The gates and drains of the PMOS transistor 210 and the NMOS transistor 211 are connected together. The source of the NMOS transistor 211 is connected to ground, while the source of the PMOS transistor 210 is connected to the drain of the first PMOS transistor 208. The second signal is generated at a point where the gates and drains of the PMOS transistor 210 and the NMOS transistor 211 are connected. The second signal changes at skewed process corners.

Figure 3:
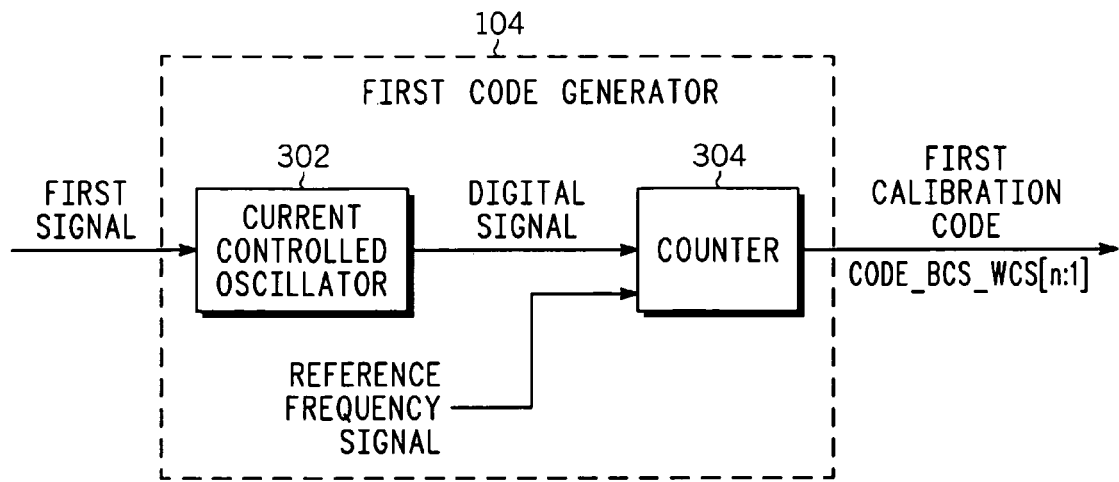
FIG. 3 is a schematic block diagram of a first code generator of the compensation circuit of FIG. 1 in accordance with an embodiment of the present invention.

The first and second signals are provided to the first code generator 104 and the second code generator 106 respectively. FIG. 3 is a schematic block diagram of the first code generator 104 in accordance with an embodiment of the present invention. The first code generator 104 includes a current controlled oscillator (CCO) 302 and a counter 304. The CCO 302 receives the first signal and generates a digital signal. The digital signal and a reference frequency signal are provided to the counter 304 to generate the first calibration code.

Figure 4:
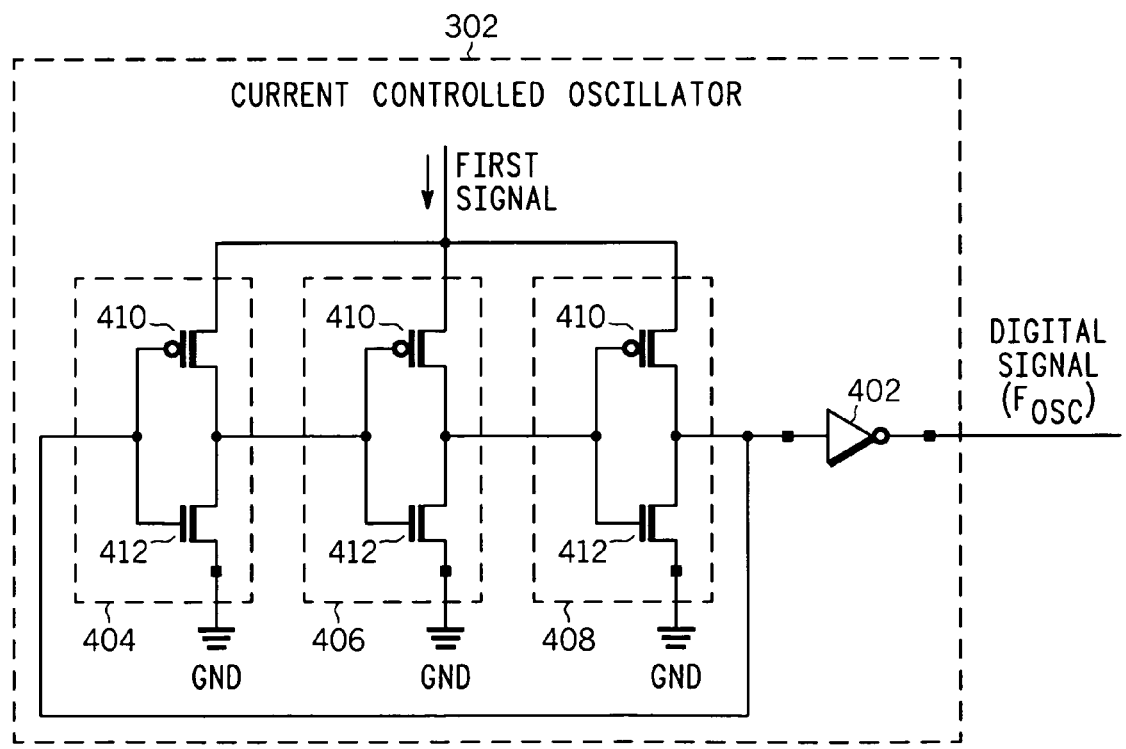
FIG. 4 is a schematic circuit diagram of a current controlled oscillator of the code generator of FIG. 3 in accordance with an embodiment of the present invention.

FIG. 4 is a schematic circuit diagram of the CCO 302 in accordance with an embodiment of the present invention. The CCO 302 includes cascaded invertors 404, 406 and 408 and an inverting driver 402. Each of the invertors 404, 406, and 408 includes a PMOS transistor 410 and an NMOS transistor 412. The first signal is provided to the sources of the PMOS transistors and the digital signal is generated at the output of the inverting driver 402. The output of the inverter 408, in addition to being input to the inverting driver 402, is input to the inverter 404, which is the first inverter in the cascade series. The digital signal output from the CCO 302 has a frequency ($F_{osc}$) that is proportional to the first signal. Since the first signal depends on the PVT variations, the output frequency of the CCO 302 also tracks process corners and so acts as the process corner detector.

Referring again to FIG. 3, the digital signal and the reference frequency signal are provided to the counter 304. The counter 304 counts the number of pulses of the digital signal in a cycle of the reference frequency signal. An exemplary frequency of the reference frequency signal is about 13 MHz. The count is output as the first calibration code, and is denoted by 'code_bcs_wcs[n:1]'. The first calibration code includes bits representing the count, code_bcs_wcs[1], . . . , code_bcs_wcs[n]. The number of bits generated by the counter 304 is n, where n is an integer. In an exemplary embodiment of the present invention, n=6. The first calibration code compensates for the aligned process corner, voltage and temperature variations associated with the functional module 110.

FIG. 5 is a schematic circuit diagram of the second code generator 106 in accordance with an embodiment of the present invention. The second code generator 106 includes comparators 502, 504 and 506 for comparing the second signal with reference voltages. The reference voltages ($S_1$, $S_2$, . . . , $S_M$) are generated by the reference module 602, described below. The second code generator 106 compares the second signal with the reference voltages ($S_1$, $S_2$, . . . , $S_M$) to generate the second calibration code denoted by 'code_skwd[M:1]'. For this purpose, each comparator 502-506 in the second code generator 106 compares the second signal with a particular reference voltage. For example, the comparator 502 compares the reference voltage $S_1$ with the second signal. If $S_1$ is greater than the second signal, then code_skwd[1] is 'HIGH'. However, if $S_1$ is less than the second signal, then code_skwd[1] is 'LOW'. In this way, the second calibration code (code_skwd[1], code_skwd[2], . . . , code_skwd[M]) is generated. In an exemplary embodiment of the present invention, M =2, and $S_1$ and $S_2$ are 1.05 V and 1.15 V, respectively.

FIG. 6 is a schematic circuit diagram of the reference module 602 in accordance with an exemplary embodiment of the present invention. In this embodiment, the reference module 602 is a voltage divider circuit. The reference module 602 includes a series of resistances ($R_0$, $R_1$, . . . $R_M$, $R_{M+1}$) connected between the voltage VDD and ground. The reference signal and the reference voltages ($S_1$, $S_2$, . . . , $S_m$) are obtained across the resistances as shown in FIG. 6. The number of reference voltages ($S_1$, $S_2$, . . . , $S_M$) is equal to the number of units having the PVT variations associated with the skewed process corners in the functional module 110.

The functional module 110 includes multiple units. The mapping module 108 maps the first calibration code onto those units of the functional module 110, which are associated with the aligned process, voltage and temperature variations. The mapping module 108 maps the second calibration code onto the units of the functional module 110 that are associated with the skewed process corners. In an embodiment of the present invention, the mapping module is a combinational logic circuit that determines which units to turn on or off in the functional module 110 depending upon the process corners.

Figure 7:
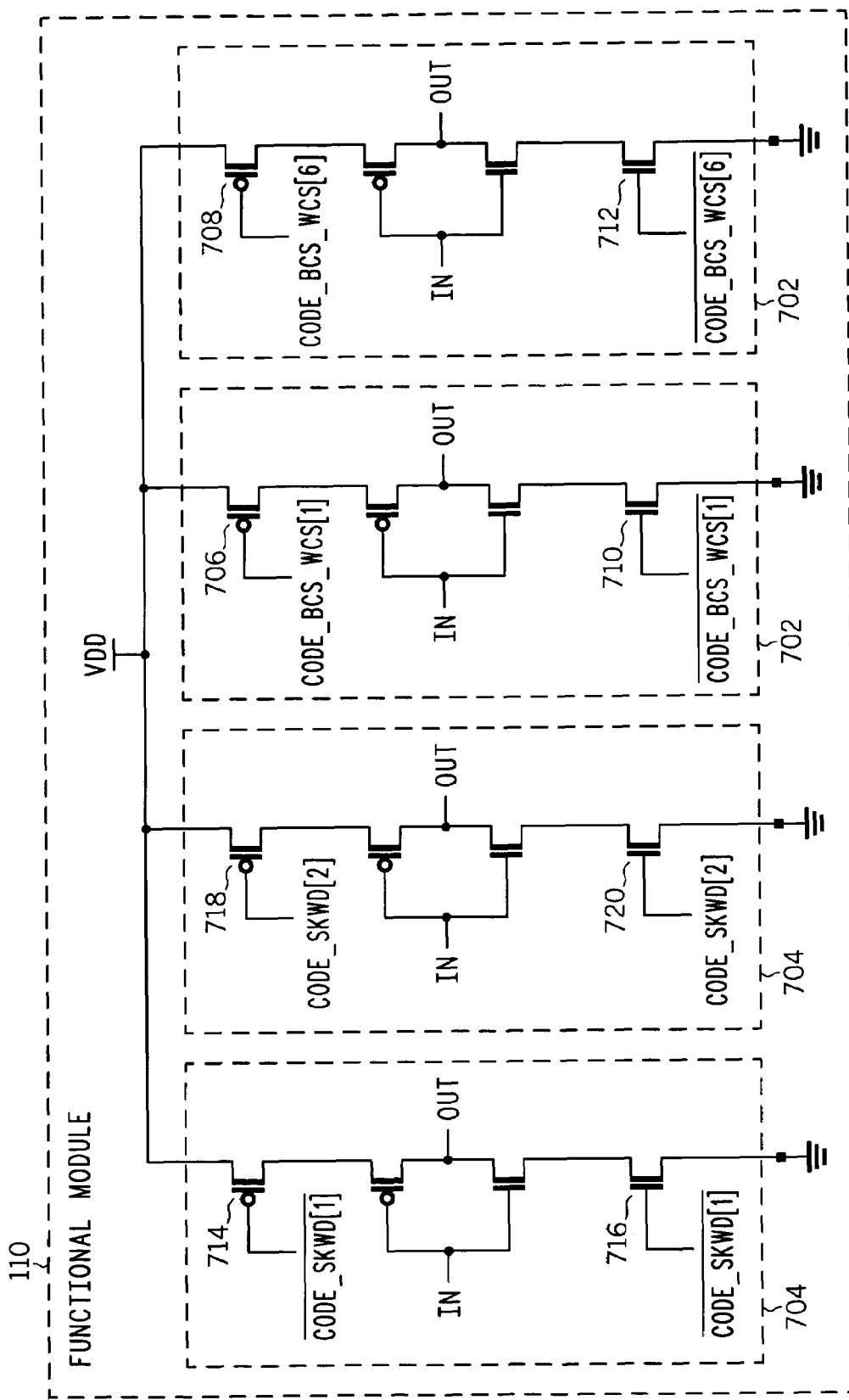
FIG. 7 is a schematic circuit diagram of a functional module in accordance with an embodiment of the present invention.

FIG. 7 is a schematic circuit diagram of the functional module 110 in accordance with an exemplary embodiment of the present invention. The functional module 110 includes a first series of inverter units and a second series of inverter units. Each inverter unit further includes a CMOS inverter, a PMOS transistor, and an NMOS transistor. The first series of inverter units include n inverter units 702 that are used to compensate for the aligned PVT variations, and are compensated by code_bcs_wcs[n:1]. The second series of inverter units includes M inverter units 704, which are used to compensate for skewed process corner variations, and are compensated by code_skwd[M:1].

The first and second series of inverter units are compensated for the PVT variations. For example, the mapping module 108 provides bit code_bcs_wcs[1] at the gate of the PMOS transistor 706, and the bit code_bcs_wcs[6] at the gate of the PMOS transistor 708 of the inverter units 702. Similarly, the mapping module 108 provides the bit $\overline{\text{code\_bcs\_wcs[1]}}$ at the gate of the NMOS transistor 710, and the bit $\overline{\text{code\_bcs\_wcs[6]}}$ at the gate of the NMOS transistor 712 in the inverter units 702, which compensates for the aligned process, voltage and temperature variations in the inverter units 702. The bits $\overline{\text{code\_bcs\_wcs[1]}}$ and $\overline{\text{code\_bcs\_wcs[6]}}$ are obtained by inverting code_bcs_wcs[1] and code_bcs_wcs[6] respectively. Further, the mapping module 108 maps the bit $\overline{\text{code\_skwd[1]}}$ at the gate of the PMOS transistor 714 and NMOS transistor 716 in the inverter units 704. Similarly, the mapping module 108 maps the bit code_skwd[2] at the gates of the PMOS transistors 718 and NMOS transistors 720 in the units 704 which compensates for the skewed process corner variations in the inverter units 704.

Figure 8:
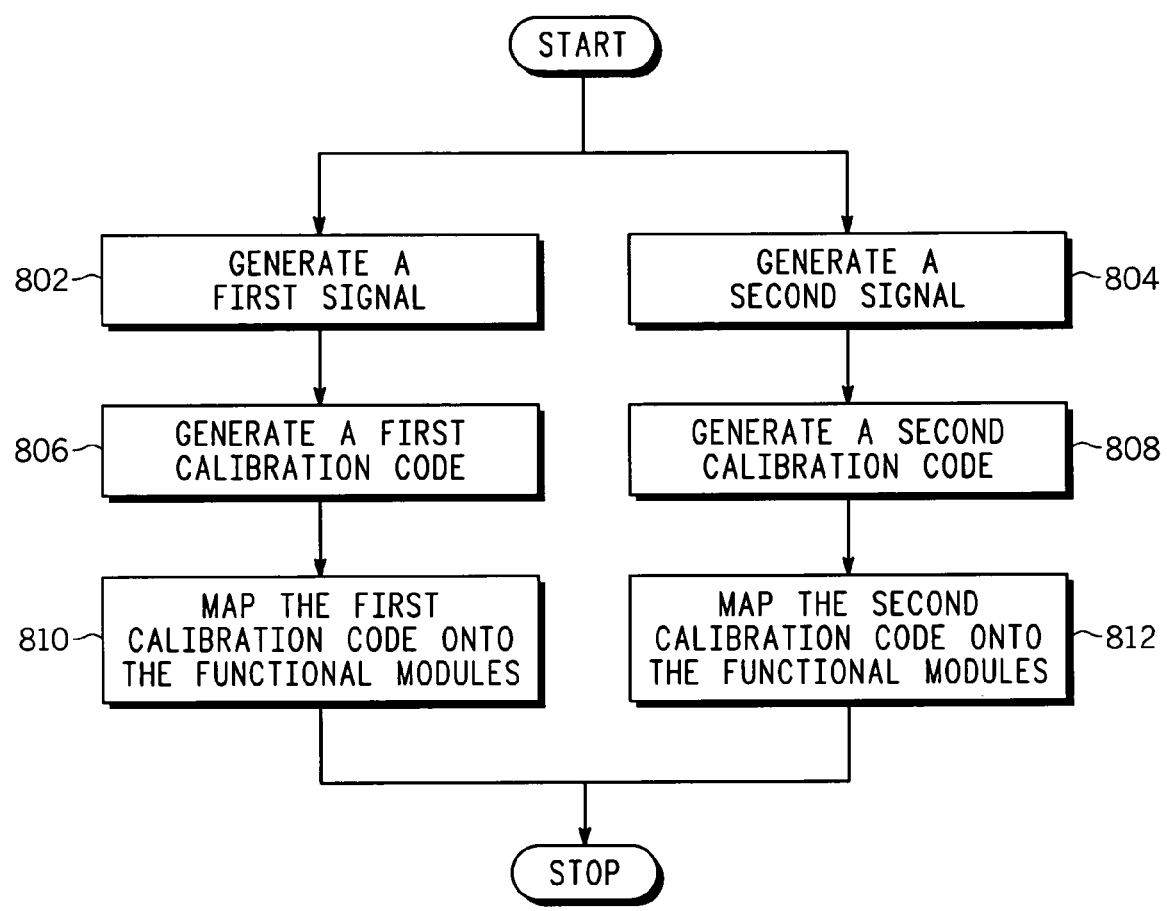
FIG. 8 is a flowchart depicting a method for compensating for process, voltage and temperature (PVT) variations in an integrated circuit in accordance with an embodiment of the present invention.

FIG. 8 is a flowchart depicting a method for compensating for process, voltage and temperature (PVT) variations in an integrated circuit, in accordance with an embodiment of the present invention. At step 802, the first signal is generated. At step 804, the second signal is generated. In various embodiments of the present invention, the steps 802 and 804 are executed substantially simultaneously. The first signal depends on the aligned process, voltage and temperature variations associated with the transistors in the signal generator 102 and second signal depends on the skewed process corners associated with the transistors of the signal generator 102. At step 806, the first calibration code code_bcs_wcs[n:1] is generated based on the first signal and the reference frequency signal. At step 808, the second calibration code code_skwd[M:1] is generated by comparing the second signal and the reference voltages ($S_1$, $S_2$, . . . , $S_M$). In various embodiments of the present invention, steps 806 and 808 are executed substantially simultaneously. At step 810, the first calibration code, code_bcs_wcs[n:1], is mapped onto the series of the inverter units 702 in the functional module 110. At step 812, the second calibration code, code_skwd[M:1], is mapped onto the series of the inverter units 704 in the functional module 110. In various embodiments of the present invention, steps 810 and 812 are executed substantially simultaneously.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A compensation circuit that compensates for process, voltage and temperature (PVT) variations in an integrated circuit, the integrated circuit including a plurality of functional modules, the compensation circuit comprising:
   a signal generator for generating a first signal and a second signal, wherein the signal generator includes a first comparator that receives a voltage reference signal and generates a reference current signal, an aligned process module connected to the first comparator and including a plurality of P-metal oxide semiconductor (PMOS) transistors from amongst the plurality of transistors, for generating the first signal using the reference current signal, whereby the first signal depends on aligned process corner for voltage and temperature associated with a plurality of transistors of the signal generator; and a skewed process module, coupled to the aligned process module and including at least one PMOS transistor and at least one N-metal oxide semiconductor transistor from amongst the plurality of transistors, for generating the second signal using the reference current signal, whereby the second signal depends on skewed process corners associated with the plurality of transistors of the signal generator;

a first code generator, coupled to the signal generator and receiving the first signal, for generating a first calibration code based on the first signal;

a second code generator, coupled to the signal generator and receiving the second signal, for generating a second calibration code based on the second signal; and a mapping module coupled to the first and second code generators for providing the first and second calibration codes to the plurality of functional modules, wherein the first calibration code compensates for the Aligned Process Corner, Voltage and Temperature variations associated with the plurality of functional modules, and the second calibration code compensates for the variations associated with the skewed process corners in the plurality of functional modules.

2. The compensation circuit of claim 1, wherein the first signal is a current signal.

3. The compensation circuit of claim 1, wherein the second signal is a voltage signal.

4. The compensation circuit of claim 1, wherein the first code generator comprises:

a current controlled oscillator (CCO) for generating a digital signal based on the first signal; and a logic counter connected to the CCO for generating the first calibration code based on the digital signal.

5. The compensation circuit of claim 4, wherein the current controlled oscillator is a ring oscillator.

6. The compensation circuit of claim 4, wherein the first calibration code is generated by counting a number of pulses of the digital signal in a clock cycle of a reference frequency signal.

7. The compensation circuit of claim 1, wherein the second code generator comprises at least one comparator for comparing the second signal with at least one reference voltage to generate the second calibration code.

8. A compensation circuit that compensates for process, voltage and temperature (PVT) variations in an integrated circuit, the integrated circuit including a plurality of functional modules, the compensation circuit comprising:

a signal generator for generating a first signal and a second signal, wherein the signal generator includes a first comparator that receives a voltage reference signal and generates a reference current signal, an aligned process module connected to the first comparator and including a plurality of P-metal oxide semiconductor (PMOS) transistors from amongst the plurality of transistors, for generating the first signal using the reference current signal, whereby the first signal depends on aligned process corner for voltage and temperature associated with a plurality of transistors of the signal generator; and a skewed process module, coupled to the aligned process module and including at least one PMOS transistor and at least one N-metal oxide semiconductor transistor from amongst the plurality of transistors, for generating the second signal using the reference current signal, whereby the second signal depends on skewed process corners associated with the plurality of transistors of the signal generator;

a current controlled oscillator (CCO) coupled to the signal generator for generating a digital signal based on the first signal;

a counter coupled to the CCO for generating a first calibration code based on the digital signal, wherein the first calibration code is generated by counting a number of pulses of the digital signal in a clock cycle of a reference frequency signal;

at least one second comparator coupled to the signal generator for comparing the second signal with at least one reference voltage to generate a second calibration code; and a mapping module coupled to the counter and the second comparator for providing the first and second calibration codes to the plurality of functional modules, wherein the first calibration code compensates for the PVT variations associated with the variations in the plurality of functional modules, and the second calibration code compensates for the variations associated with the skewed process corners in the plurality of functional modules.

9. The compensation circuit of claim 8, wherein the first signal is a current signal.

10. The compensation circuit of claim 8, wherein the second signal is a voltage signal.

11. The compensation circuit of claim 8, wherein the current controlled oscillator is a ring oscillator.

* * * * *